United States Patent
Vaillant

(10) Patent No.: US 7,291,826 B2
(45) Date of Patent: Nov. 6, 2007

(54) IMAGE SENSOR WITH A CONJUGATE LENS ARRANGEMENT

(75) Inventor: Jérôme Vaillant, Chambery (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/202,936

(22) Filed: Aug. 12, 2005

(65) Prior Publication Data

US 2006/0033008 A1 Feb. 16, 2006

(30) Foreign Application Priority Data

Aug. 13, 2004 (FR) .................................. 04 51847

(51) Int. Cl.
*H01J 3/14* (2006.01)
*H01L 31/00* (2006.01)

(52) U.S. Cl. .................... 250/214.1; 250/216; 257/432

(58) Field of Classification Search ............. 250/214.1, 250/216; 257/431, 432
See application file for complete search history.

(56) References Cited

U.S. PATENT DOCUMENTS

| | | | | |
|---|---|---|---|---|
| 5,739,548 A | * | 4/1998 | Shigeta et al. ................. | 257/59 |
| 5,796,154 A | * | 8/1998 | Sano et al. .................. | 257/432 |
| 6,188,094 B1 | * | 2/2001 | Kochi et al. ................. | 257/232 |
| 6,605,850 B1 | | 8/2003 | Kochi et al. | |
| 6,614,479 B1 | * | 9/2003 | Fukusho et al. ............. | 348/340 |
| 6,753,557 B2 | * | 6/2004 | Nakai .......................... | 257/233 |
| 2003/0168679 A1 | | 9/2003 | Nakai et al. | |
| 2005/0242271 A1 | * | 11/2005 | Weng et al. .............. | 250/214.1 |

OTHER PUBLICATIONS

French Search Report from French Patent Application No. 04/51847, filed Aug. 13, 2004.
Patent Abstracts of Japan, vol. 1999, No. 05, May 31, 1999 & JP 11 040787 A (Sony Corp).
Patent Abstracts of Japan, vol. 016, No. 108 (E-1179), Mar. 17, 1992 & JP 03 283572 A (Sony Corp.).

* cited by examiner

*Primary Examiner*—Georgia Epps
*Assistant Examiner*—Stephen Yam
(74) *Attorney, Agent, or Firm*—Lisa K. Jorgenson; James H. Morris; Wolf, Greenfield & Sacks, P.C.

(57) ABSTRACT

An image sensor pixel structure including a photosensitive area; a stacking of insulating layers covering the photosensitive area; and a device for focusing the light of the pixel to the photosensitive area. The focusing device includes first and second microlenses, the first microlens being arranged between layers of the stacking and substantially conjugating the second microlens with the photosensitive area.

16 Claims, 4 Drawing Sheets

IMAGE SENSOR WITH A CONJUGATE LENS ARRANGEMENT

BACKGROUND OF THE INVENTION

1. Field of the Invention

The present invention relates to an image sensor comprising a matrix of photosensitive cells arranged in lines and columns and formed in a CMOS-type technology.

2. Discussion of the Related Art

FIG. 1 schematically shows an image sensor formed of a matrix of pixels 1 receiving through an objective 2 the image of a distant object field of vision 3. The image of a point A located in the middle of the object plane will form substantially in the middle of matrix 1. The image of a point B located at the edge of the object plane will form at the edge of matrix 3.

FIG. 2 is a cross-section view of a substantially central photosensitive cell 6 of an image sensor formed on a substrate 7, for example, silicon. Photosensitive cell 6 is associated with a portion of the surface of substrate 7 which, in top view, generally has the shape of a square or of a rectangle. Photosensitive cell 6 comprises an active photosensitive area 8 generally corresponding to a photodiode capable of storing a quantity of electric charges according to the received light intensity. Substrate 7 is covered with a stacking of transparent insulating layers 9, 11, 12, 13 which may be, as an example, alternatively silicon oxide and silicon nitride. Conductive tracks 14, formed between adjacent insulating layers, and conductive vias 16, formed between two conductive tracks, especially enable addressing photosensitive area 8 and collecting electric signals provided by photosensitive area 8. Conductive tracks 14 and conductive vias 16 are generally metallic. As an example, aluminum, tungsten, copper, and metal alloys may be used. Such materials are opaque and possible reflective. In a color sensor, a color filter element 17, for example, an organic filter, is arranged on the stacking of insulating layers 9, 11, 12, 13 at the level of photosensitive cell 6. The elements of color filter 17 are generally covered with a planarized equalization layer 18 which defines an exposition surface 19 exposed to light.

The maximum light sent by objective 2 (FIG. 1) on the portion of exposition surface 19 associated with photosensitive cell 1 must be directed towards photosensitive active area 8. For this purpose, a microlens 21 is arranged on equalization layer 18, opposite to photosensitive area 8 to focus the light rays on photosensitive area 8. The paths of two rays of light R1, R2 are schematically shown as an example for photosensitive cell 6. Conductive tracks 14 and conductive vias 16 are arranged to avoid hindering the passing of the rays of light. Microlens 21 is for example obtained by covering equalization layer 18 with a resin. The resin is etched to delimit distinct resin blocks, each resin block being arranged substantially opposite to a photosensitive area 8. The resin blocks are then heated. Each resin block then tends to deform by reflow to obtain a convex external surface 22. As an example, for a photosensitive cell 6 with a 4-μm side and for a distance on the order of from 8 to 10 μm between a microlens 21 and the associated photosensitive area 8, the maximum thickness of microlens 21 is approximately 0.5 μm.

Photosensitive area 8 only covers a portion of the surface of substrate 7 associated with photosensitive area 6. Indeed, a portion of the surface is reserved to devices for addressing and reading photosensitive area 8. For clarity, these devices have not been shown in FIG. 2.

FIG. 3 is a cross-section view of a photosensitive cell 6 of an image sensor located at the edge of the pixel matrix. Two rays R1', R2' have been shown as an example. It can be observed that the focusing of rays R1' and R2' is performed on the side of photosensitive area 8. Thus, a portion at least of the light spot provided by microlens 21 does not hit photosensitive area 8 and the image edges will appear, for a same lighting, darker than the image center. This results in a loss of peripheral sensitivity due to the offset of the image projected on the peripheral portions of the photosensitive cell matrix.

It is constantly attempted to decrease the dimensions of image sensors to be able to integrate an always-increasing number thereof on a same surface of a substrate. This results, for photosensitive cell 6, in a decrease in lateral dimension d of photosensitive cell 8. However, distance T between microlens 21 and photosensitive area 8 generally does not significantly vary. The ratio between distance T and lateral dimension d thus tends to increase. Microlens 21 must thus be less converging to enable focusing on photosensitive area 8. Microlens 21 must thus be thinner, which requires that the resin layer deposited on equalization layer 18 must be thinner. In the steps of reflow of the resin blocks etched in the resin layer, it becomes in practice difficult to obtain a microlens with a shape enabling it to have the light rays converge properly. Further, the increase of this ratio tends to increase the size of the ray of light at the level of the photosensitive area which can then become wider than the photosensitive area. This results in a loss in the available light intensity. A third limitation of the current manufacturing process results from the presence of conductive tracks 14 and of conductive vias 16 which can be obstacles and hinder the passing of the light rays.

SUMMARY OF THE INVENTION

The present invention aims at providing an image sensor formed of a matrix of photosensitive cells enabling focusing, for each photosensitive cell, more light on the photosensitive area of the photosensitive cell than allowed by the image sensor described in the state of the art.

Another object of the present invention is to overcome the peripheral sensitivity loss of an image sensor.

To achieve these and other objects, the present invention provides an image sensor pixel structure comprising a photosensitive area, a stacking of insulating layers covering the photosensitive area, and a device for focusing the pixel light on the photosensitive area. The focusing device comprises first and second microlenses, the first microlens being arranged between layers of the stacking and substantially conjugating the second microlens with the photosensitive area.

According to an embodiment of the present invention, the sensor comprises a surface of exposition to light and the second microlens is located on the exposition surface.

According to an embodiment of the present invention, the first microlens is formed of a first material having a first refraction index, the layers of the stacking adjacent to the first microlens being formed of a second material having a second refraction index smaller than the first refraction index.

According to an embodiment of the present invention, the first microlens is based on silicon nitride between two silicon oxide layers.

According to an embodiment of the present invention, the first microlens is substantially arranged at one third of the distance between the second microlens and the photosensitive area.

The present invention also aims at an image sensor comprising an assembly of pixel structures such as hereabove.

According to an embodiment of the present invention, the optical axis of the first microlens and the optical axis of the second microlens of at least one pixel structure of the pixel structure assembly are parallel and offset.

According to an embodiment of the present invention, the offset between the optical axis of the first microlens and the optical axis of the second microlens increases as it is moved away from the center of the image sensor.

The present invention also aims at a method for manufacturing an image sensor, comprising the steps of forming a photosensitive area at the level of a substrate; forming a first stacking of insulating layers; forming for the photosensitive area a first microlens; forming a second stacking of insulating layers; and forming for the photosensitive area a second microlens so that for the photosensitive area, the first corresponding microlens conjugates the second corresponding microlens with said photosensitive area.

According to an embodiment of the present invention, the step of forming the first microlens comprises the steps of: depositing a layer based on silicon nitride; depositing a resin layer on the first stacking; forming straight above each desired position of a first microlens a resin block having the desired shape of the first microlens; and etching the resin block and the silicon nitride based layer to form the first microlens in the silicon nitride based layer, the first microlens having the shape of the associated resin block.

BRIEF DESCRIPTION OF THE DRAWINGS

The foregoing objects, features, and advantages of the present invention will be discussed in detail in the following non-limiting description of specific embodiments in connection with the accompanying drawings.

DETAILED DESCRIPTION

Figure 1:
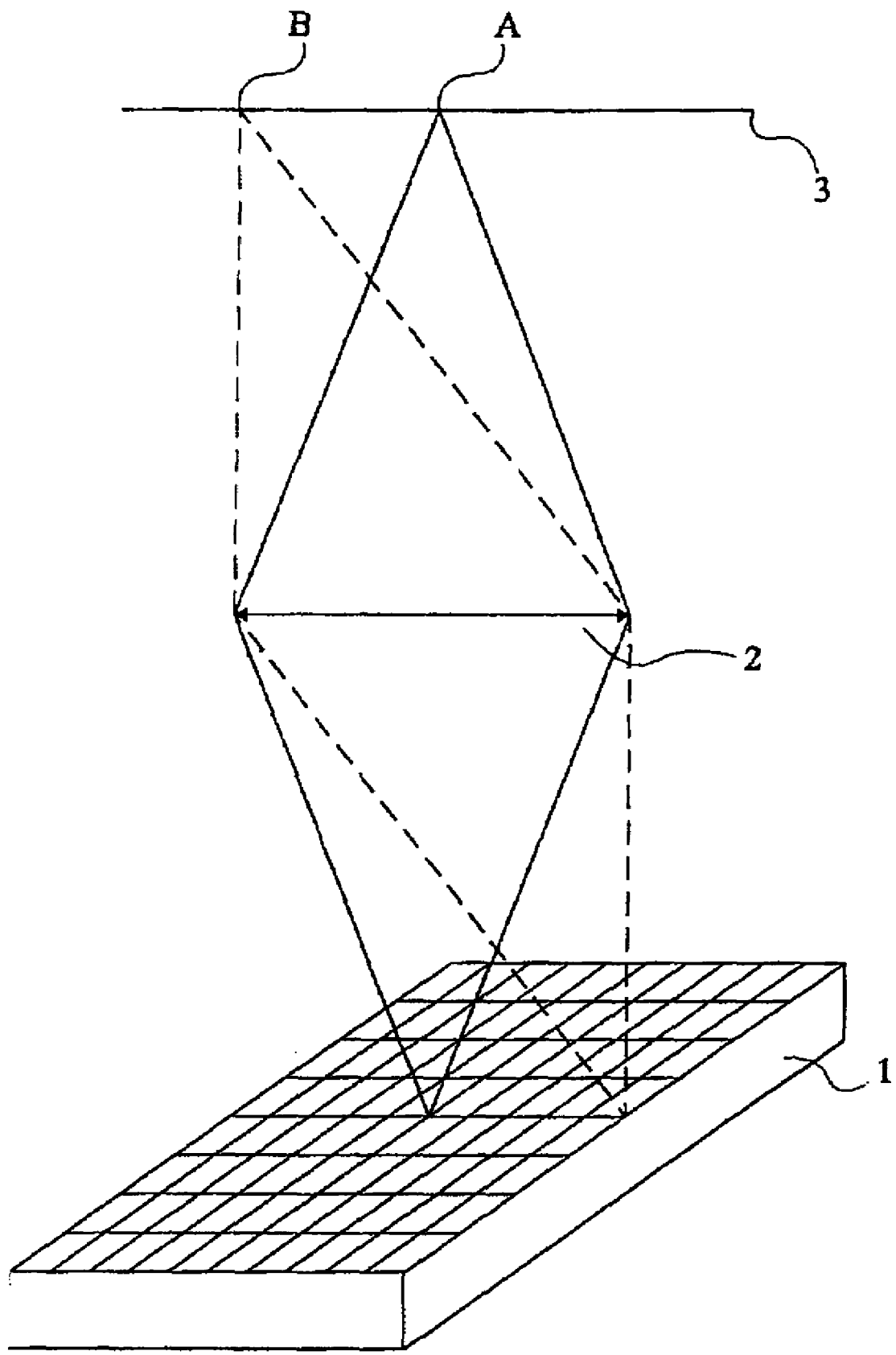
FIG. 1, previously described, is a simplified perspective view of an image sensor.

For clarity, the same elements have been designated with the same reference numerals in the different drawings and, further, as usual in the representation of integrated circuits, the various drawings are not drawn to scale.

Figure 2:
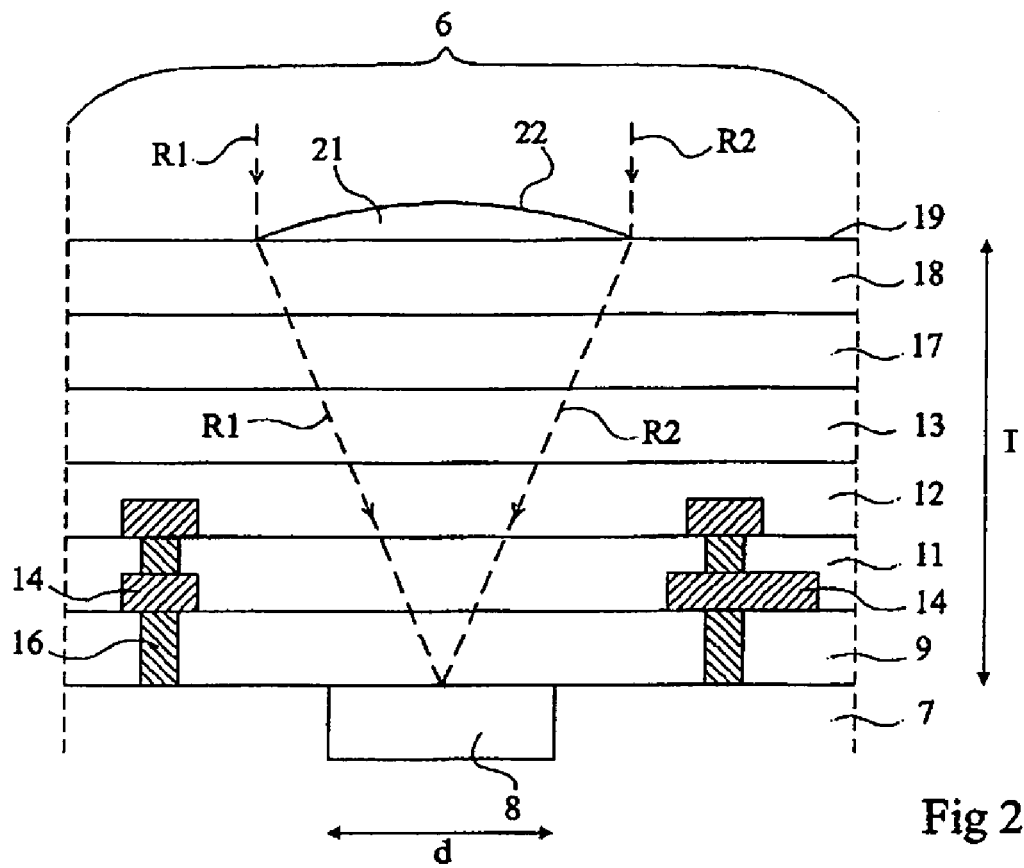
FIG. 2, previously described, is a simplified cross-section view of a photosensitive cell of an image sensor.
Figure 3:
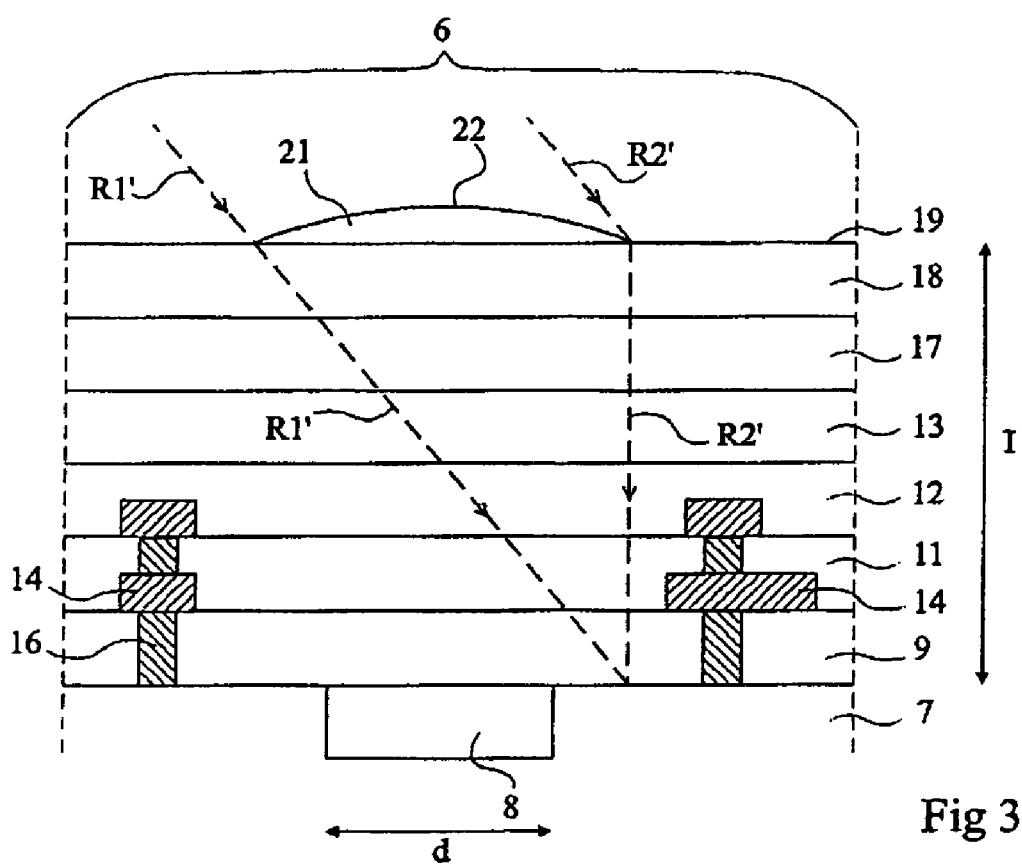
FIG. 3, previously described, is a simplified cross-section view of a photosensitive cell located at the edge of the pixel matrix.
Figure 4:
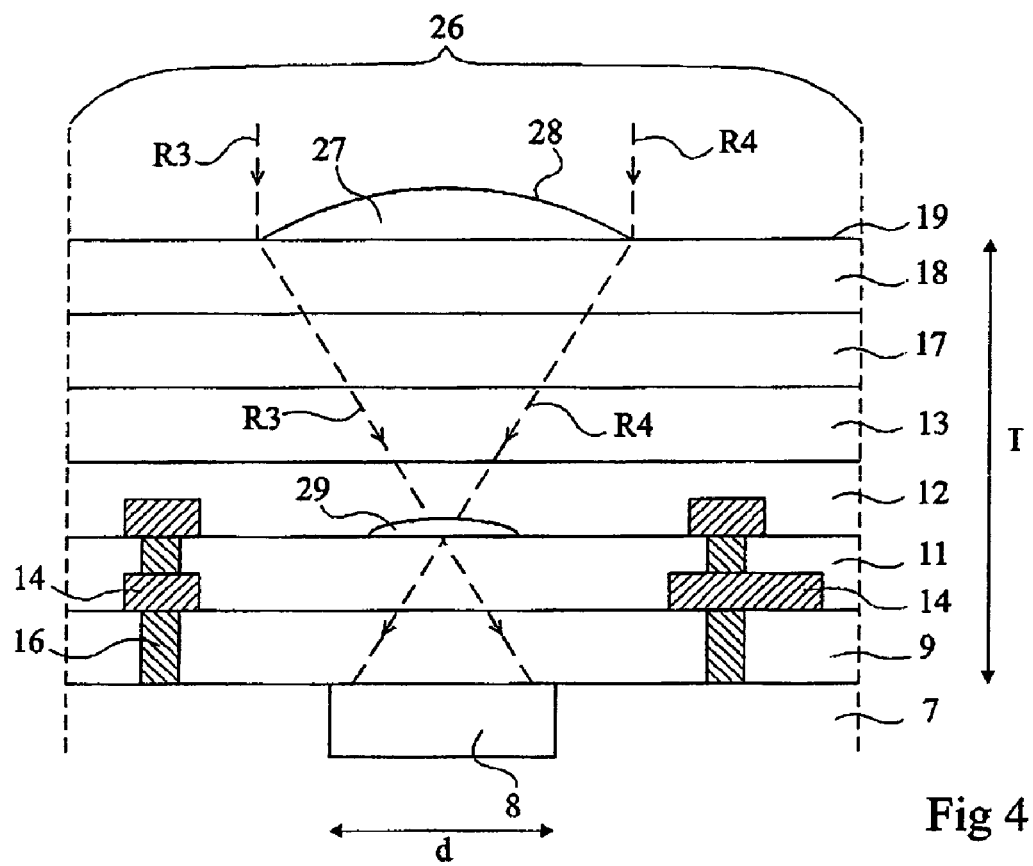
FIG. 4 is a simplified cross-section view of a photosensitive cell of an image sensor according to the present invention.

FIG. 4 is a cross-section view of an example of the forming of a photosensitive cell 26 of an image sensor. Cell 26 substantially has the same structure as cell 6 of FIG. 2. However, between insulating layers 11, 12 of the stacking of insulating layers 9, 11, 12, 13, photosensitive cell 26 comprises a microlens 29. A planarized equalization layer 18 covers filter element 17, the upper surface of layer 18 forms exposition surface 19 exposed to light on which a microlens 27 is arranged. The focus length of microlens 29 is selected so that microlens 29 forms the image of microlens 27 on the associated photosensitive area 8. In other words, microlens 29 conjugates the plane of microlens 27 and that of the associated photosensitive area 8, with a magnification smaller than or equal to the ratio between size d of the photosensitive area and the size of photosensitive cell 26 (or of microlens 27). A focusing device enabling focusing the light on photosensitive area 8 has thus been formed. The optical axis of microlens 29 is substantially confounded with that of microlens 27. Rays R3 and R4 shown as an example converge on microlens 29, conversely to rays R1 and R2 which, as for them, would directly converge on photosensitive area 8. For a same distance T between the microlens and the photosensitive area, microlens 27 is thus more converging than microlens 21. External surface 28 of microlens 27 is more convex and thus easier to form by the standard reflow manufacturing method.

A first advantage of the present invention thus lies in the implementation of a method for forming microlens 27 which is simpler, more reliable, and thus more repeatable.

Figure 5:
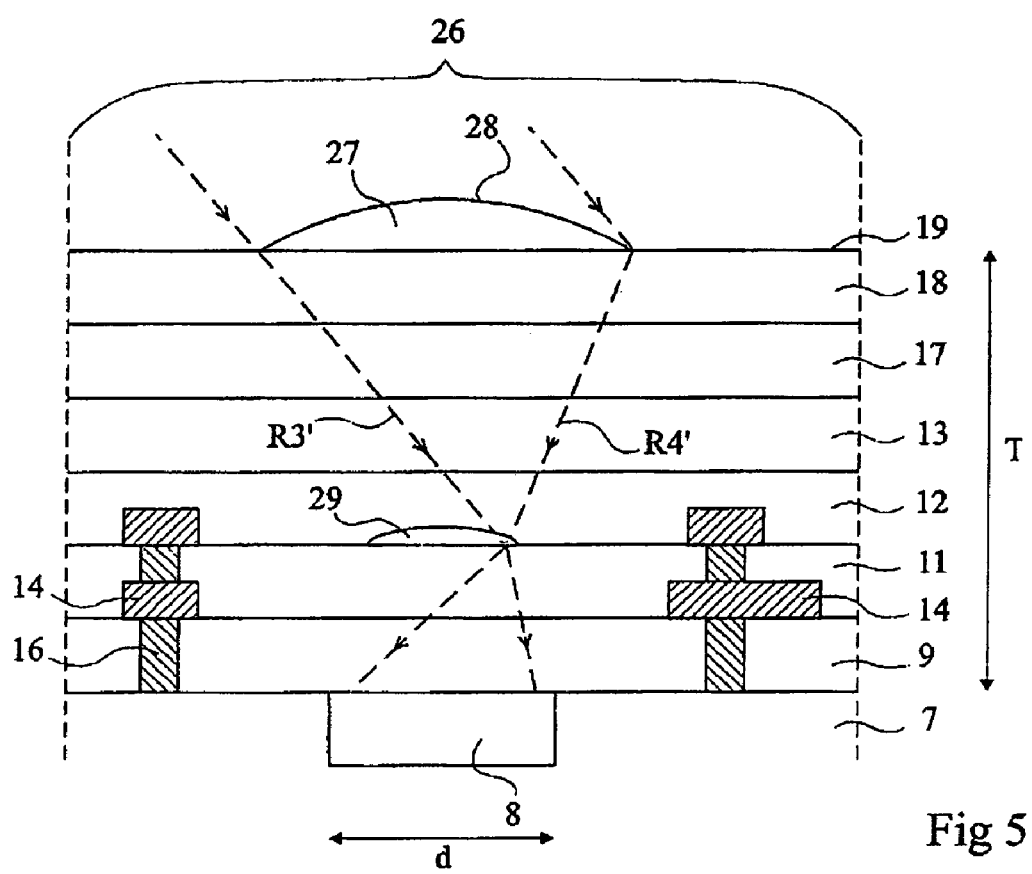
FIG. 5 is a simplified cross-section view of a photosensitive cell according to the present invention located at the edge of the pixel matrix.

FIG. 5 is a cross-section view of a photosensitive cell 26 located on the edge of a pixel matrix. Light rays R3' and R4' have been shown as an example. Microlens 29 conjugating microlens 27 with photosensitive area 8, rays R3' and R4' converge on microlens 29. The image is then restored on photosensitive area 8 with no light intensity or resolution loss although the pixel structure is at the edge of the matrix.

A second advantage of the present invention thus is an improvement of the peripheral sensitivity in the restoring of the image on photosensitive area 8, resulting from an automatic realignment of the image of a peripheral area.

In a limiting case in which the optical axis of microlens 29 should be offset with respect to the optical axis of microlens 27 (as represented by 29' in FIG. 4), to ensure the image forming on photosensitive area 8, microlens 29 will only have to be displaced. A much less expensive correction than a new arrangement of the pixel structures which would require using a new set of masks will thus have been performed.

Figure 6A:
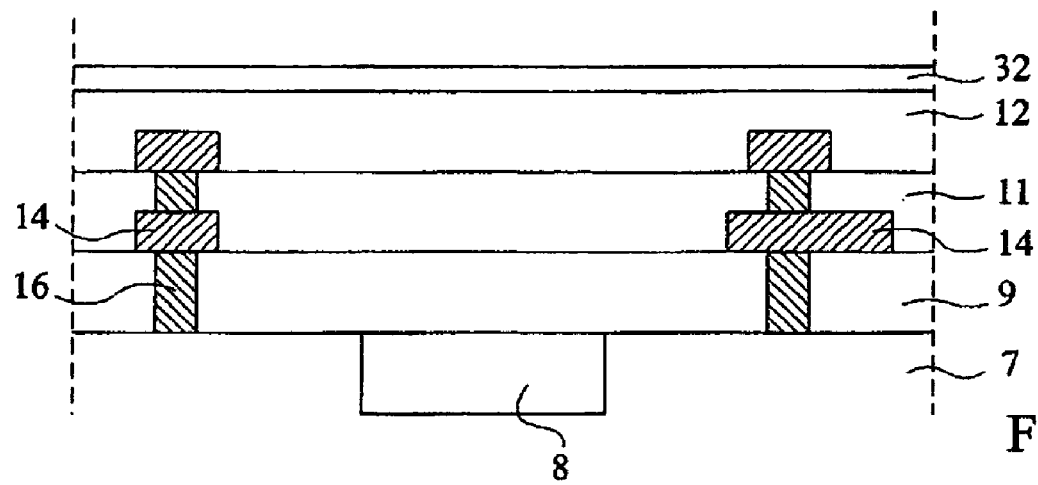
FIGS. 6A, 6B, and 6C illustrate successive steps of a method for forming a cell according to the present invention.
Figure 6B:
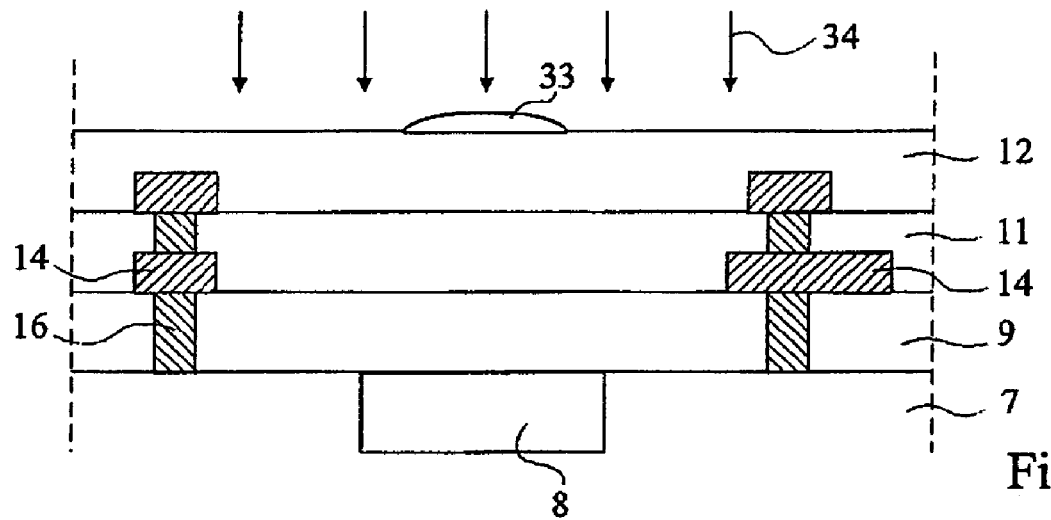
Figure 6C:
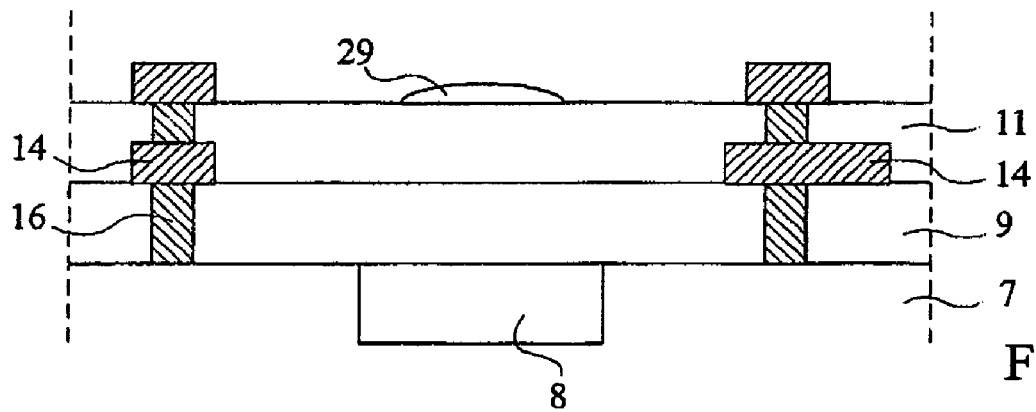

FIGS. 6A, 6B, and 6C show a photosensitive cell according to the present invention at different steps of an example of an image sensor manufacturing method according to the present invention.

FIG. 6A illustrates the result of first steps of manufacturing of a pixel structure. In the case where substrate 7 is formed of N-type doped silicon, photosensitive areas 8 are formed by ion implantation of P-type dopants. An insulating layer 9 in which conductive vias 16 are formed is then deposited. Afterwards, conductive tracks 14 are manufactured before depositing a second insulating layer 11. It is proceeded as previously for the forming of conductive vias 16 and conductive tracks 14 associated with insulating layer 11 before rearranging an insulating layer 12. Insulating layer 12 is, for example, made of silicon nitride while insulating layer 11 is for example made of silicon oxide. A resin layer 32 is then deposited.

FIG. 6B illustrates a convex structure 33 obtained after etching of resin layer 32 and reflow of the etched resin blocks. The next step is a step of uniform etch in the direction of arrows 34. Convex resin structure 33 and insulating layer 12 are etched uniformly and selectively with respect to insulating layer 9 and to conductive tracks 14 by plasma etch. The shape of convex structure 33 is reproduced at the level of layer 11. Such a step is called a shape transfer.

FIG. 6C shows the structure obtained at the end of the shape transfer step, which results in the shape of microlens 29.

Of course, the present invention is likely to have various alterations, modifications, and improvements which will readily occur to those skilled in the art. In particular, the devices shown in the examples of embodiment have been shown for devices comprising two levels of conductive tracks 14 and two levels of conductive vias 16. These devices may be formed with a smaller or greater number of levels of conductive tracks 14 and of lower or upper conductive via levels 16. The position of microlens 29 may vary and thus not necessarily be above the second level of conductive vias 16. Indeed, microlens 29 may be formed in a lower or upper level. Microlens 29 may be based on silicon nitride and be made of an SiNO compound.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A pixel structure of an image sensor comprising:
   a photosensitive area,
   a stack of insulating layers covering the photosensitive area, and
   a device to focus light received by the pixel structure onto the photosensitive area, the device comprising first and second microlenses, the first microlens being arranged in the insulating layers and positioned to substantially conjugate the second microlens with the photosensitive area.

2. The pixel structure of claim 1, wherein the second microlens is located on an exposition surface of the pixel structure, the exposition surface positioned on a side of the stack of insulating layers opposite to the photosensitive area.

3. The pixel structure of claim 1, wherein the first microlens is made of a first material having a first refraction index, and a layer of the stack of layers that is adjacent to the first microlens being made of a second material having a second refraction index smaller than the first refraction index.

4. The pixel structure of claim 3, wherein the first microlens comprises silicon nitride positioned between two silicon oxide layers.

5. The pixel structure of claim 1, wherein the first microlens is substantially arranged at one third of the distance between the second microlens and the photosensitive area.

6. An image sensor comprising an assembly of pixel structures as recited in claim 1.

7. The image sensor of claim 6, wherein an optical axis of the first microlens and an optical axis of the second microlens of at least one pixel structure of the pixel structure assembly are parallel and offset to one another.

8. A method for manufacturing an image sensor, comprising the steps of:
   forming a photosensitive area at the level of a substrate;
   forming a first stack of insulating layers on the substrate;
   forming a first microlens for each photosensitive area;
   forming a second stack of insulating layers such that the first microlens is positioned between the first and second stacks of insulating layers; and
   forming a second microlens for each photosensitive area, the second microlens positioned so that the corresponding first microlens conjugates the second microlens with the photosensitive area.

9. The method of claim 8, wherein the step of forming the first microlens comprises the steps of:
   depositing a layer comprising silicon nitride;
   depositing a resin layer on the first stack of insulating layers;
   forming a resin block above each desired position of a first microlens, the resin block having a shape that corresponds to the first microlens; and
   etching the resin block and the silicon nitride layer to form the first microlens in the silicon nitride layer, the first microlens corresponding to the shape of the resin block.

10. A pixel structure of an image sensor, the pixel structure comprising:
    a photosensitive area;
    a first insulator disposed above the photosensitive area;
    a first microlens disposed above the first insulator;
    a second insulator disposed above the first microlens; and
    a second microlens disposed above the second insulator;
    wherein the first microlens is positioned to conjugate the second microlens and the photosensitive area.

11. The pixel structure of claim 10, wherein the second microlens is located on an exposition surface of the pixel structure, the exposition surface positioned on a side of the stack of insulating layers opposite to the photosensitive area.

12. The pixel structure of claim 10, wherein the first microlens is made of a first material having a first refraction index, and the first insulator is made of a second material having a second refraction index smaller than the first refraction index.

13. The pixel structure of claim 12, wherein the first microlens comprises silicon nitride positioned between two silicon oxide layers.

14. The pixel structure of claim 10, wherein the first microlens is substantially arranged at one third of the distance between the second microlens and the photosensitive area.

15. An image sensor comprising an assembly of pixel structure as recited in claim 10.

16. The image sensor of claim 15, wherein an optical axis of the first microlens and an optical axis of the second microlens of at least one pixel structure of the pixel structure assembly are parallel and offset to one another.

* * * * *